United States Patent [19]

Russell et al.

[11] Patent Number: 5,079,516
[45] Date of Patent: Jan. 7, 1992

[54] USER-PROOF POST-ASSEMBLY OFFSET VOLTAGE TRIM

[75] Inventors: Ronald W. Russell, Sunnyvale; Craig N. Lambert, San Jose, both of Calif.

[73] Assignee: National Semiconductor Corporation, Santa Clara, Calif.

[21] Appl. No.: 571,378

[22] Filed: Aug. 21, 1990

[51] Int. Cl.[5] ............................................. H03F 3/45
[52] U.S. Cl. ..................................... 330/261; 330/307
[58] Field of Search ............................... 330/261, 307

[56] References Cited

U.S. PATENT DOCUMENTS 4,481,478 11/1984 Flink et al. ..................... 330/261 X
4,851,786 7/1989 Vinn et al. ......................... 330/252

Primary Examiner—James B. Mullins
Attorney, Agent, or Firm—Gail W. Woodward; Matthew A. Glenn; James W. Rose

[57] ABSTRACT

A post-assembly trim of a monolithic IC is set forth wherein selected package pins can be employed to address the on-chip trim circuit. Then, after the trim is completed, the circuit is addressed to provide a disconnect of the coupling between the trim pins and the post assembly trim circuit of the IC, while leaving the pins fully usable for other purposes. This means that following the post-assembly trim the trim pins cannot accidentally be employed for further trimming and the packaged IC is user-proof. A circuit that employs zener zapping for both trimming and disconnect is detailed and the invention is clearly usable for plastic encapsulated devices. However, when cavity containing packages are involved it is shown that a combination of zener zapping and fuse blowing can be employed.

7 Claims, 2 Drawing Sheets

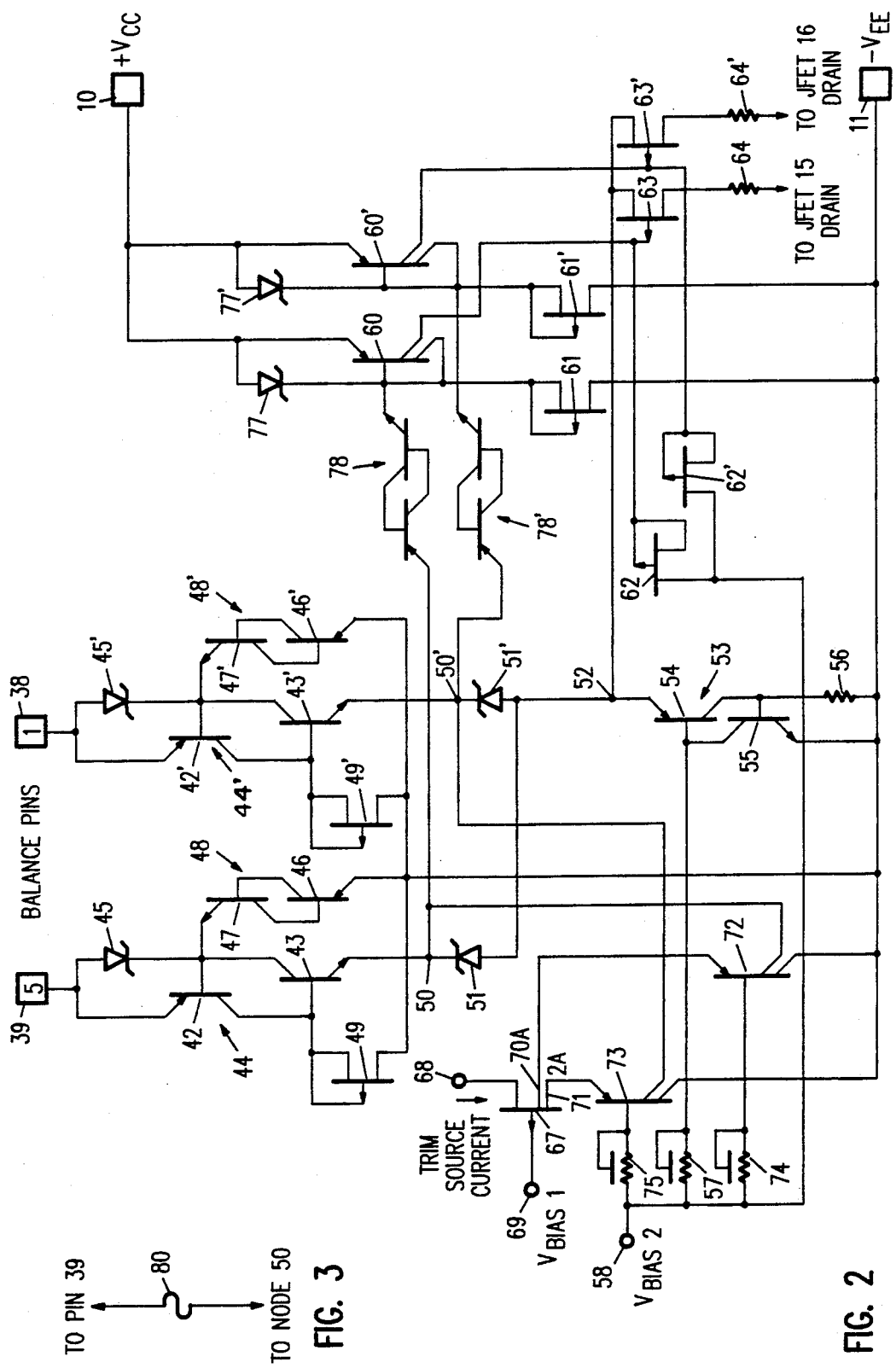

USER-PROOF POST-ASSEMBLY OFFSET VOLTAGE TRIM

BACKGROUND OF THE INVENTION

The invention relates to integrated circit (IC) devices of the operational amplifier (op-amp) type which has a differential amplifier (diff-amp) input stage. Such devices are made to have a very low input offset voltage and, typically, include means for connecting a potentiometer which can be adjusted to further reduce the offset voltage to substantially zero. Offset voltage is defined as that voltage which must be applied between the input terminals through two equal resistors to obtain zero output voltage. Where the IC is designed to operate from a single $V_{CC}$ supply, the zero output voltage is replaced with $V_{CC}/2$, or one half of the supply voltage. Typically, high performance IC's are rated at an offset voltage in the range of one or a few millivolts. In more stringently specified devices the value can be as low as a few tens of microvolts.

In the manufacture of IC op-amps it is common practice to perform a trim operation that reduces the offset voltage to bring it into specification. Also, the typical device circuitry to further reduce the offset voltage to any desired value. The manufacturing trim operation is commonly done at wafer sort where the individual IC chips are probed and tested to determine functionality. Then, only the good chips are assembled into a final package. During the wafer probing operation the working chips are typically trimmed to bring the offset voltage into specification. This trim is commonly done by zener zapping which is taught in Russell U.S. Pat. No. 4,618,833. In some cases zener zapping is replaced or augmented by the use of metal links which can be blown as a fuse or laser severed to produce a trim. The preferred circuit detailed in U.S. Pat. No. 4,618,833 is a BIFET ® IC device. This is a registered trademark of NATIONAL SEMICONDUCTOR CORPORATION covering IC devices that include thin junction field effect transistors (JFETs). The teaching in this patent, which is assigned to the assignee of the present invention, is incorporated herein by reference.

While an IC can be wafer trimmed to produce a low offset voltage, it has been found that a shift can be produced by the final assembly. This is particularly true of BISFET ® IC devices. It is thought that this is due to the presence of very thin JFET structures which are more strain sensitive than conventional IC components. Accordingly, it is desirable for an offset voltage trim to be accomplished after the IC is assembled.

SUMMARY OF THE INVENTION

It is an object of the invention to provide an IC op-amp trim that can be performed after assembly.

It is a further object of the invention to provide a post-assembly IC trim that does not employ fuse elements so that plastic molded encapsulation can be used.

It is a still further object of the invention to provide an IC trim that can be performed after assembly and that further can be subsequently disabled to make it user-proof.

These and other objects are achieved as follows. First, the IC is wafer trimmed to produce a low offset voltage. Then, the wafer is diced into chips which are then packaged. Certain of the package pins are coupled to on chip trim circuitry. This on chip trim circuitry involves the following functions. A trim current is developed to provide a plurality of digitally related components each one of which is applied to a zener diode. These diodes are commonly connected to a pair of JFET switches that direct the trim current components to one or the other side of the differential input stage. Once the IC is operated and the sign and magnitude of the offset noted, one of the diodes controlling the switch pair is zapped. The zapped diode is determined by the offset voltage polarity and the particular diode is selected to oppose the offset. The zener diodes that relate to the digitally related trim currents are selected in a combination that will most nearly provide the required trim and the appropriate zener diodes are zapped. At this point, the IC should be within specification. Afterward, the trim circuit, which is provide with disconnect circuitry, is operated to invoke the disconnect. This isolates the trim circuit from the package pins so that the IC is thereafter user-proof.

BRIEF DESCRIPTION OF THE DRAWING

FIG. 2 is a schematic diagram of a trim circuit, according to the invention, that can be applied to the FIG. 1 circuit.

FIG. 3 is a schematic alternative circuit showing a fuse in place of a latch circuit.

DESCRIPTION OF THE PRIOR ART

Figure 1:
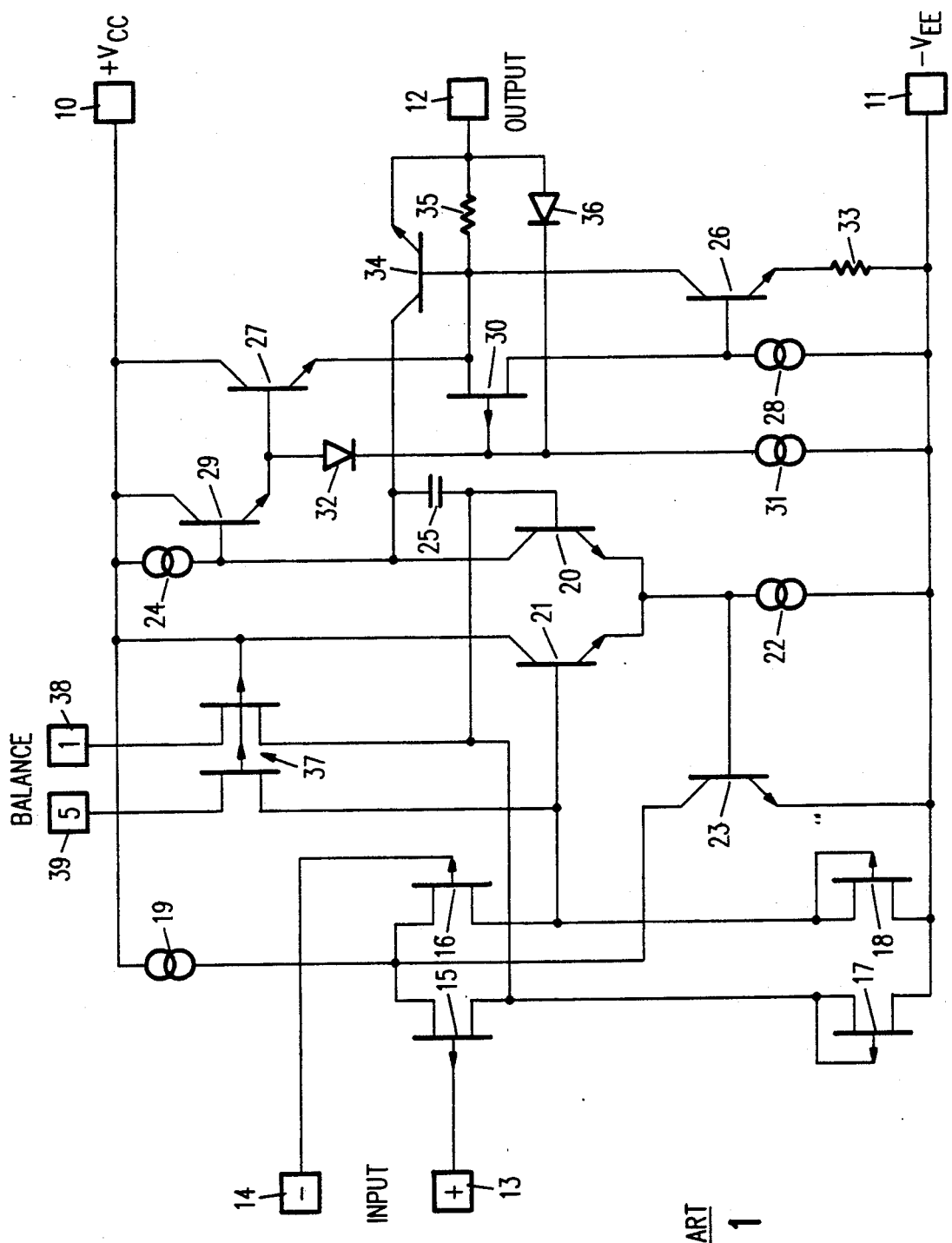
FIG. 1 is a simplified schematic diagram of a well known prior art BIFET ® integrated circuit.

FIG. 1 is a simplified schematic diagram of an LF155 BIFET ® monolithic JFET input operational amplifier (op-amp). The amplifier operates from a power supply connected + to $V_{CC}$ terminal 10 and − to $V_{EE}$ terminal 11. This can be a dual supply, if desired, or it can be a single supply. In either case, output terminal 12 normally operates at a potential that is midway between the potentials at terminals 10 and 11 in the quiescent state. Input terminals 13 and 14 are the differential noninverting and inverting inputs respectively.

This kind of amplifier has a very high input impedance because of input JFETs 15 and 16. JFETs 17 and 18 each have their gates returned to their sources and thereby act as load elements respectively for input JFETs 15 and 16. The input stage is operated differentially with a constant tail current supply 19. In the input stage JFET's 15 and 16 are matched and JFET's 17 and 18 are matched so that a balanced operation results.

Transistors 20 and 21 form a differential second stage amplifier which has its tail current provided by constant current sink 22. The bases of transistors 20 and 21 are directly coupled to and driven respectively by the drains of JFETs 15 and 16. Transistor 23 has its base connected to the emitters of transistors 20 and 21 and its collector connected to the sources of JFETs 15 and 16. Thus, transistor 23 responds to the common mode potentials at the drains of JFETs 15 and 16 and forms a negative feedback stabilizing loop that substantially establishes the circuit first stage common mode voltage. Thus, while differentially operated JFET's 15 and 16 will display a high common mode rejection ratio, it will be substantially enhanced by the feedback loop.

The collector of transistor 21 is returned to the positive supply rail and the collector of transistor 20 is returned to the same rail by way of constant current source 24 which operates at one-half of the constant current in sink 22. Thus, the collector of transistor 20 represents a single-ended output from the second stage.

Capacitor 25 forms a frequency compensation capacitor that acts to reduce the gain of the second stage with increasing frequency. This provides a high frequency gain reduction of 6 db per octave.

The first and second stages, described above, are taught and claimed in U.S. Pat. No. 3,959,733 which issued to the assignee of the present invention on May 25, 1976. The teaching in this patent is incorporated herein by reference.

Transistors 26 and 27 comprise the amplifier output stage that employs like-conductivity type devices. It is configured to drive a capacitive load and is capable of sinking a substantial current from a capacitive load without producing a relatively large phase shift. Transistor 27 is driven by transistor which is connected as an emitter follower. JFET 30 is coupled as an inverting amplifier which drives transistor 26 in phase opposition with transistor 27. It can be seen that the gate of JFET 30 is biased at its source potential so that regardless of signal conditions transistor 27 is never completely cut off. This biasing condition greatly stabilizes the circuit and improves its high frequency operation.

Constant current sink 31 acts as the emitter load for transistor 29. Diode 32, which is forward biased by the current in source 31, acts as a bias level shifter. It can be seen that the gate and source of JFET 30 are operated at one diode below the base of transistor 27. JFET 30, in combination with transistor 26, forms a unity gain signal inverting amplifier. Transistor 34 is present to act as an output source current limiter which is biased by the potential dropped across resistor 35. Under ordinary load conditions the drop across resistor 35 is insufficient to cause transistor 34 to conduct and the circuit functions normally. However, when the output is pulled down, due to a fault condition that will result in excessive conduction, the current sourced by the output stage is sufficient to turn transistor 34 on. Its conduction will pull the base of transistor 29 down so as to relieve the excessive output current. Diode 36 is present to pull the gate of JFET 30 up when the output sink current through resistor 35 biases diode 36 on. This provides sink current limiting.

Current sink 28, which matches sink 31, establishes the current in JFET 30 and biases transistor 26. Resistor 33 acts as a degeneration element in the emitter of transistor 26 to stabilize the amplifier and to match the output transistor gain.

The output stage described above is taught and claimed in U.S. Pat. No. 3,974,456 which issued on Aug. 10, 1976, to the assignee of the present invention. The teaching in this patent is incorporated herein by reference.

Finally, with reference to FIG. 1, a balance circuit 37 is incorporated into the device. A pair of IC balance terminals 38 and 39 are connected to the sources of a JFET pair, the gates of which are connected to the positive supply rail. If terminals 38 and 39 are left open, the balance circuit 37 will have no effect on the IC. However, a potentiometer (not shown) can have its element terminals connected to terminals 38 and 39 with its wiper arm connected to the positive supply rail. This potentiometer can then be adjusted to cancel the IC offset potential. This means that the balance circuit 37 can inject controlled imbalanced currents into the drains of JFETs 15 and 16.

DESCRIPTION OF THE INVENTION

In the manufacture of an IC, of the kind illustrated in FIG. 1, it is common to provide circuit trimming while the ICs are in their wafer form. For example, it is common practice to trim the sizes of JFETs 17 and 18 so that the input stage offset voltage is below a critical specification. In their design both of these transistors can include incrementally controlled size adjustments invoked by zener zapping. The size of one of the load transistors can be increased by a desired increment. Typically, the offset potential is less than about 750 microvolts after wafer trim. Additionally, the input offset potential trim, shown in U.S. Pat. No. 4,618,833 (mentioned above) can be employed. In this circuit, a dummy input stage is provided with a predetermined constant offset so that its output current is related to temperature in the same way as that of the input stage. The dummy output current is applied to the JFET input stage in a controlled sign and magnitude selected to reduce the offset potential to below the critical specification. The patent teaches the use of zener zapping to effect the trim. This kind of trim is desired particularly if the trim is to be accomplished after IC assembly. If the trim scheme shown in U.S. Pat. No. 4,618,833 is employed each terminal of each zener diode is connected to an IC chip pad and the probe fingers, applied during wafer probing, can be employed, not only to test the circuit, but to zap the appropriate zeners to do the trimming.

FIG. 2 is a schematic diagram of a post assembly trim circuit that can be addressed by way of the IC balance pins. Since these pins are a part of the finished IC, and constitute the means for connecting a balancing potentiometer thereto, no extra trim pins need to be added to the package. However, extra package pins dedicated to the trimming can be employed, if desired. Furthermore, after the post assembly trim is completed, means to be detailed hereinafter are incorporated to electrically disable the trim circuit. Thus, the ultimate IC user cannot alter the trim either deliberately or accidentally.

Transistors 46 and 47 are coupled together to form a latch 48 that functions as a thyristor. Since the circuit created thereby is to be employed several times in FIG. 2, its action will now be described in detail only once. The emitter of transistor 46 forms the thyristor anode and the emitter of transistor 47 forms the cathode. When such a latch is reverse biased, the emitter of transistor 47 is positive with respect to the emitter of transistor 46. Since the emitter-base junction of lateral PNP transistor 46 will sustain a large reverse bias, the latch conduction will be biased off and only a small leakage current will flow. However, when the emitter of transistor 47 is biased negative with respect to the emitter of transistor 46, the latch is forward biased. When the bias exceeds about one low current $V_{BE}$+one $V_{SAT}$ (about 0.52 volt at 300° K.) the latch will go into an on state. In this state, each transistor biases the other one on and the cross-coupling ensures that the combination will latch. With a forward bias the conduction can be considerable. Such a latch will remain on until the current flowing therein drops to a relatively low value. Ordinarily, the current supply must be interrupted to turn the latch off. In its on state the voltage drop across the latch will vary from about 0.52 to 1.24 volts as the current is increased to about 100 ma at 300° K.

Complementary transistors 42 and 43, which are coupled as shown to form latch 44, can be turned on as long as zener diode 45 is intact. The collector of transistor 42 being connected to the base of transistor 43 will turn it on and latch 44 will be conductive so long as balance pin 39 is kept high (close to the positive supply rail). Latch 44 couples pin 39 to circuit node 50.

JFET 49, which has its gate returned to its source, acts as a high value resistor returned to the negative supply rail. Accordingly, it will sink any leakage current that may ordinarily flow in the collector of transistor 42 that might turn transistor 43 on. This action is particularly important at the higher ambient IC temperatures.

Zener diode 51 couples circuit node 50 (the output of latch 44) to node 52. Elements 42 through 51 are repeated as elements 42' through 51' which are coupled between balance pin terminal 38 and node 52. Their functions are identical and will not be discussed separately.

The potential at node 52 is established by the action of a thyristor 53 which is composed of complementary transistors 54 and 55. These transistors are cross-coupled in a latch configuration. The base of transistor 55 is shunted by resistor 56 and pinch resistor 57 returns the base of transistor 54 to a source of bias potential 58. This source is typically about four volts above the $-V$ rail before either diode 77 or 77' is zapped. The action of thyristor 53 will clamp node 52 at a level that is the drop across resistor 57 plus the $V_{BE}$ of transistor 54 above terminal 58. This voltage will normally be quite small, less than 0.6 volt at 300° K. This will place node 52 at typically about 4.3 volts above the $-V$ rail. This is high enough to ensure that zener diodes 51 and 51' are normally biased below their zener voltage level.

Transistors 60 and 60' are dual collector lateral transistors each of which has a first collector returned to its base JFETs 61 and 61' are respectively coupled to the bases of transistors 60 and 60' to conduct a small current to the $-V$ rail. This will tend to turn transistors 60 and 60' on. JFETs 62 and 62' respectively conduct the currents in the second collectors of transistors 60 and 60' to the $V_{BIAS2}$ terminal 58. JFETs 63 and 63' have their sources commonly coupled to node 52 and their drains respectively coupled by resistors 64 and 64' to the drains of JFETs 15 and 16 (of FIG. 1). The gates of JFETs 63 and 63' are respectively connected to the second collectors of transistors 60 and 60'. Thus, conduction in transistors 60 and 60' will pull the gates of FETs 63 and 63' up so as to pinch them off. In this circuit condition no offset correction current will flow.

A trim current, $I_{TRIM}$, which can be developed as illustrated in U.S. Pat. No. 4,618,833, is applied to the source of JFET 67 via terminal 68. The gate of JFET 67 is returned to a first bias source, $V_{BIAS1}$, at terminal 69. This bias is typically about 4.3 volts below the $+V$ rail. JFET 67 has a pair of ratioed drains 70 and 71 with drain 71 having twice the current of drain 70. Thus, $I_{TRIM}$ will be divided with one-third going to transistor 72 and two-thirds going to transistor 73. The bases of transistors 72 and 73 are respectively returned to $V_{BIAS2}$ at terminal 58 by way of pinch resistors 74 and 75. Each of tranistors 72 and 73 has a pair of collectors one of which is returned to the $-V$ rail. The other collectors are returned to nodes 50 and 50'. When zener diodes 51 and 51' are intact it can be seen that their voltage drops will pull the second collectors of transistors 72 and 73 high so as to saturate them. Accordingly, under these conditions, $I_{TRIM}$ will flow exclusively to the $-V$ rail by way of the first collectors. However, if either one of zener diodes 51 and 51' is zapped the associated collector of transistors 72 or 73 will be pulled to the node 52 potential and a portion of the trim current will flow thereto. Transistors 72 and 73 are constructed so that the collectors that are returned to the $-V$ rail are less efficient than the other collectors. Thus, when turned on the high efficiency collectors, connected to zener diodes 50 and 50', dominate and most of the current into the emitter flows in them. Thus, the selective zapping of zener diodes 51 and 51' will introduce a fraction of $I_{TRIM}$ to the sources of JFETs 63 and 63' and this trim current fraction will have a discrete value of 0, 1, 2, or 3.

As was explained earlier, transistors 60 and 60' respectively normally bias JFETs 63 and 63' off. It will be noted that zener diodes 77 and 77' respectively shunt the emitter base circuits of transistors 60 and 60'. Thus, under initial condition neither diodes 77 nor 77' will have any reaction. However, if either zener diode 77 or 77' is zapped its conduction will short out the emitter base circuit of the associated transistor. This will turn off either transistor 60 or 60' depending upon which zener diode is zapped. If transistor 60 is turned off, transistor 62 will pull the gate of JFET 63 low and thereby turn it on. Then the trim current will be applied to the drain of JFET 15 (of FIG. 1). Alternatively, if zener diode 77' is zapped, transistor 60' will be turned off and JFET 62' will pull the gate of transistor 63' low so as to turn it on. For this condition the trim current will be applied to the drain of JFET 16 (of FIG. 1). After zener diodes 77 or 77' are zapped potential at $V_{BIAS2}$ falls because the conduction in JFETs 62 and 62' is decreased. Whereas previously node 52 was at about 4.3 volts, zapping diodes 77 or 77' will drop the potential at node 52 to about 2.4 volts. The exact value will be a function of the conduction in zener diodes 51 and 51'

From the above it can be seen that zener diodes 77 and 77' determine the sign of the trim and zener diodes 51 and 51' determine the magnitude. Thus, the circuit is capable of trim increments of zero and integers of up to +3, a total range of 6.

Zener diodes 77 and 77' can be zapped by raising terminals 39 or 38 to a potential that exceeds that of the $+V$ terminal 10 by significantly above the zener voltage or typically about 25 volts. The current is limited to about 300 ma at the clamped voltage level. The other IC circuit pins are left open for this action. Thus, a zapping current will flow in either diode 77 or 77' by way of either terminal 39 or 38 and by way of either thyristor 44 or 44' and either thyristor 78 or 78'. These thyristors will be forward biased into their forward conduction by the zapping supply.

Either one or both of zener diodes 51 or 51' can be zapped by coupling a voltage clamped current source between either or both of pins 39 or 38 and the $-V$ terminal 11. For this action all of the other circuit pins are left open. For example, a 300 ma current source clamped at about 25 volts is connected negative to terminal 11 and positive to either terminal 38 and/or 39. This will zap zener diodes 51' and/or 51.

In the processing sequence, after final assembly, the IC is first measured and the offset magnitude and sign determined. These numbers will determine the magnitude and sign of the trim action. Then, depending upon the trim sign, either zener diode 77 or 77' is zapped and then either or both of zener diodes 51 and 51' are zapped. It is to be understood that since the IC was wafer trimmed the only post assembly trim needed is to correct any shift that might have occurred in the final assembly.

Once the IC has been trimmed after final assembly, zener diodes 45 and 45' will be zapped to disable thyristors 44 and 44'. This is done by pulling pins 38 and 39 below the −V terminal 11 by a zapping voltage clamped 300 ma current source. In this state thyristors 48 and 48' are forward biased so that the zapping current will flow in zener diodes 45 and 45'. Once zeners 45 and 45' are zapped transistors 42 and 42' cannot conduct. This removes the trim circuit from the IC so that pins 38 and 39 can perform their ordinary function of IC balance trim. Clearly, after the trim sequence has been performed, and zeners 45 and 45' zapped, the person who buys the IC cannot accidentally change the original trim. Nor will it be changed by the action of ESD testing or actual ESD action.

It is to be understood that while the circuit shown has a trim range of +3 a greater range could be employed. This could be important in accommodating a wider trim range or a more accurate trim. For example, another package pin could be coupled by way of a third set of components, identical to elements 42 through 49, to a third zener diode which also commonly couples to node 52. Then, a third anode, ratioed at 4, would be added to JFET 67. A third similar transistor would be coupled in parallel with transistors 72 and 73 to direct the current from the newly added drain of JFET 67 to either the −V rail or the newly added zener diode. This would increase the trim range to ±7.

The circuit of FIG. 2 represents the preferred embodiment of the invention and is useful for all IC's in any plastic encapsulated DIP. Where the device is housed in a package that includes a cavity, such as the well known industry standard "H" or "J" packages, it has been found that thyristors 44 and 44' can be replaced by fuses incorporated into the IC metallization as shown in FIG. 3. Here a fuse 80 replaces latch 44 of FIG. 2. Latch 44' can be similarly replaced with a fuse. These fuses are made large enough to survive the zener zapping current, but can be blown with a higher current, after the post assembly trim, to finally disconnect the trim circuit. This approach is not amenable to plastic encapsulated IC's because the plastic encapsulant will not permit the escape of the vaporized fuse elements.

The invention has been described and a preferred embodiment detailed. Alternative embodiments have also been described. When a person skilled in the art reads the foregoing description, alternatives and equivalents, within the spirit and intent of the invention, will be apparent. Accordingly, it is intended that the scope of the invention be limited only by the claims that follow.

We claim:

1. In a monolithic integrated circuit which includes an operational amplifier having a differential input stage that can be trimmed after final assembly, an offset voltage trim circuit comprising:
   means for coupling a plurality of final package pins to said trim circuit;
   means for generating a trim current comprising a plurality of digitally related individual trim currents;
   means for applying one or more of said individual trim currents in combination to said input stage;
   means for selecting to which side of said differential input stage said individual trim currents are applied; and
   means for disconnecting said trim circuit from said final package pins whereby said trim circuit cannot be accessed after trimming.

2. The offset trim circuit of claim 1 wherein said means for coupling comprises latches connected between said package pins and said means for applying wherein said latches can conduct programming information to said means for applying and said latches include means for rendering said latches inoperative to provide said means for disconnecting.

3. The offset trim circuit of claim 1 wherein said means for coupling comprises fuse links connected to said package pin and said means for applying wherein said fuse links can conduct programming information to said means for applying and wherein said fuse links can be blown open to provide said means for disconnecting.

4. The offset trim circuit of claim 1 wherein said means for generating a trim current comprises a plural drain JFET with said drains scaled digitally to produce said individual trim currents.

5. The offset trim circuit of claim 4 wherein each drain of said plural drain JFET is coupled to a common circuit node by an individual zener diode and said individual zener diode can be zapped to couple its individual trim current to said common circuit node.

6. The offset trim circuit of claim 5 wherein a switch circuit is incorporated to steer the trim current at said common circuit node to one side or the other of said differential input stage, with said steering being determined by a pair of zener diodes, one of which is zapped to determine which input stage side is to receive said trim current.

7. In a process for trimming a monolithic integrated circuit chip housed within a package comprising the steps:
   including a trim circuit on the chip whereby a differential amplifier input stage can be trimmed to reduce its offset voltage;
   connecting the pins of said package to said chip;
   providing means on said chip for electrically coupling particular ones of said package pins to said trim circuit;
   applying electrical control signals to said particular ones of said package pins to produce said trim; and
   providing means on said chip to permanently disable said means for electrically coupling whereby said trim circuit can be electrically isolated; and
   applying electrical control signals to said particular ones of said package pins to activate said means to permanently disable said means for electrically coupling after said trim sequence has been completed while maintaining the use of said package pins for other purposes following said disabling step.

* * * * *